United States Patent
Liu et al.

(10) Patent No.: US 8,230,905 B2
(45) Date of Patent: Jul. 31, 2012

(54) HEAT DISSIPATION DEVICE HAVING A FAN HOLDER

(75) Inventors: Jian Liu, Shenzhen (CN); Jing Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 492 days.

(21) Appl. No.: 12/488,526

(22) Filed: Jun. 20, 2009

(65) Prior Publication Data

US 2010/0212863 A1    Aug. 26, 2010

(30) Foreign Application Priority Data

Feb. 25, 2009 (CN) .......................... 2009 1 0300538

(51) Int. Cl.
*F28F 7/00* (2006.01)
*H01L 23/467* (2006.01)
*H05K 7/20* (2006.01)

(52) U.S. Cl. ........ 165/80.3; 165/121; 361/697; 361/704

(58) Field of Classification Search ................. 165/80.3, 165/121, 122, 67; 61/695, 697; 403/362; 415/175–178, 213.1, 214.1
See application file for complete search history.

(56) References Cited

U.S. PATENT DOCUMENTS

| | | | | |
|---|---|---|---|---|
| 3,493,039 A | * | 2/1970 | Edwards | 165/67 |
| 2008/0135215 A1 | * | 6/2008 | Wu | 165/104.33 |
| 2009/0161316 A1 | * | 6/2009 | Xu | 361/700 |

* cited by examiner

*Primary Examiner* — Allen J. Flanigan
*Assistant Examiner* — Jason Thompson
(74) *Attorney, Agent, or Firm* — Altis Law Group, Inc.

(57) ABSTRACT

A heat dissipation device includes a fin group, a fan and two fan holders fixing the fan onto a front side of the fin group. The fin group defines two elongated slots in two opposite lateral side thereof and two receiving grooves in two opposing inner faces of each elongated slot. The receiving grooves have openings defined at a top of the fin group. Each fan holder has a main plate attached to a lateral side of the fin group and a locking plate connected to an inner side of the main plate and being inserted into the two receiving grooves of a corresponding elongated slot from the openings at the top of the fin group.

20 Claims, 5 Drawing Sheets

HEAT DISSIPATION DEVICE HAVING A FAN HOLDER

BACKGROUND

1. Technical Field

The present disclosure relates generally to a heat dissipation device, and more particularly to a heat dissipation device having a heat sink and a fan holder for facilitating a mount of a fan on the heat sink, wherein the fan holder also functions as a fan duct to guide an airflow flowing from the fan to electronic devices.

2. Description of Related Art

Generally, in order to ensure the normal running of an electronic device, a heat dissipation device is used to dissipate heat generated by the electronic device. A conventional heat dissipation device includes a heat sink and a fan attached on the heat sink to improve a heat-dissipation capacity of the heat sink.

When installing the fan to the heat sink, it is generally to fix the fan to a side of the heat sink via a fan holder with screws. However, using the screws requires a lot of manpower and material resources. Furthermore, it is necessary to remove the fan at first by unscrewing the screws when disassembling and maintaining the heat dissipation device. Such unscrewing operation is tiresome for a user. In addition, it is also possible that the unscrewed screws may fall into a computer in which the heat dissipation device is mounted to cause damages to components of the computer.

What is need therefore is a heat dissipation device having a design which makes assembling and disassembling of a fan to/from a heat sink of the heat dissipation device be convenient and easy.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
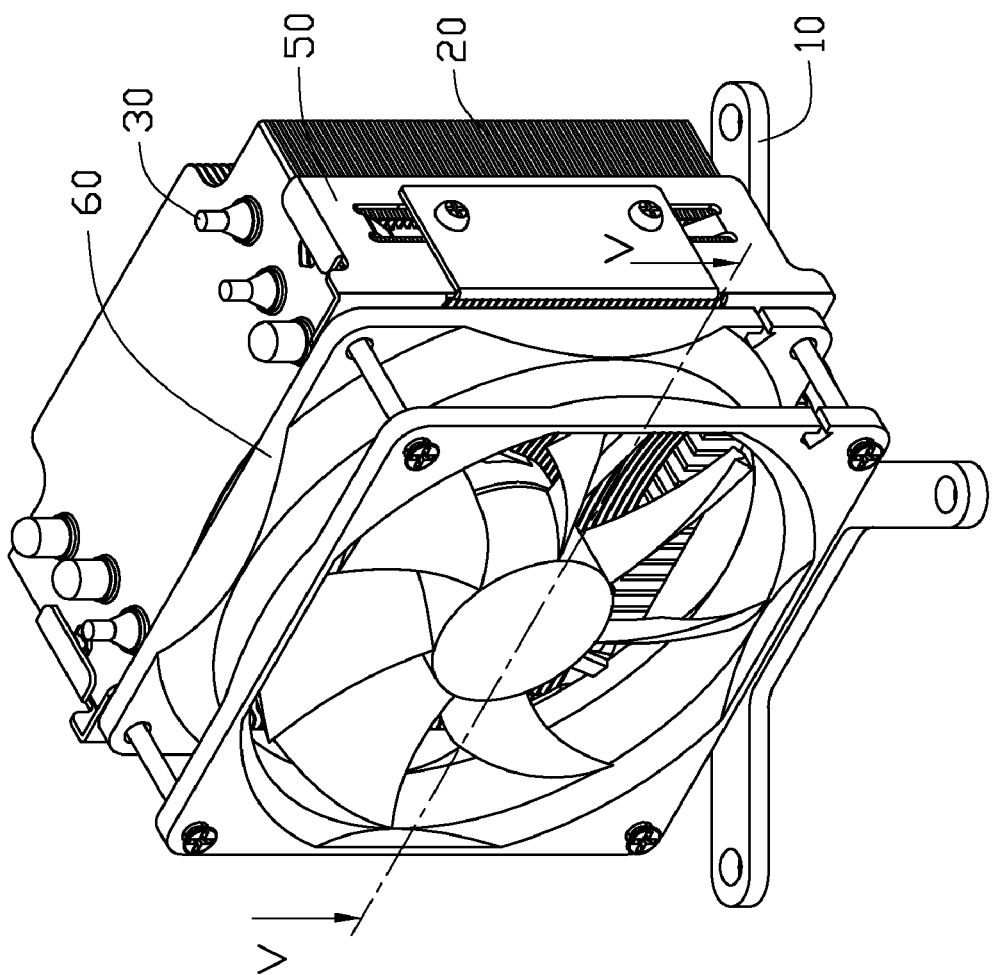
FIG. 1 is an isometric, assembled view of a heat dissipation device in accordance with an embodiment of the present disclosure.
Figure 2:
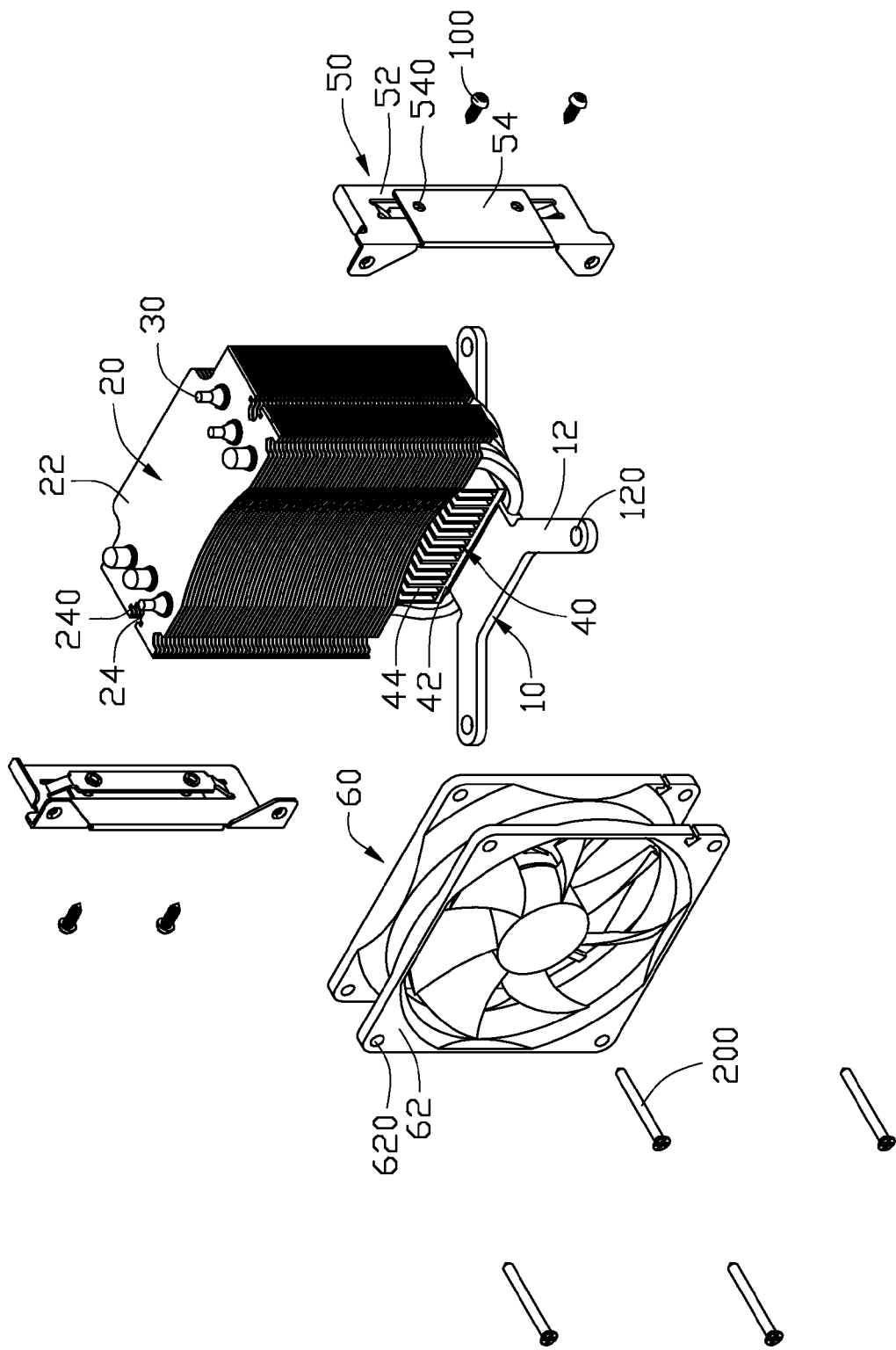
FIG. 2 is an exploded view of the heat dissipation device of FIG. 1.

FIGS. 1 and 2 illustrate a heat dissipation device in accordance with a preferred embodiment of the present disclosure. The heat dissipation device is provided for removing heat from a heat-generating component such as a CPU (not shown). The heat dissipation device comprises a base 10, a fin group 20, a plurality of heat pipes 30 thermally connecting the base 10 and the fin group 20 together, a heat dissipating member 40 located between the fin group 20 and the base 10, two fan holders 50 attached to two lateral sides of the fin group 20 and a fan 60 mounted on a front side of the fin group 20 above the base 10 via the fan holders 50.

The base 10 acting as a heat receiver is formed of a material with a good heat conductivity such as aluminum or copper and has a bottom surface contacting with the heat-generating component. The base 10 has four fixing legs 12 extending diagonally from four corners thereof. Each of the fixing legs 12 defines a fixing hole 120 therein adjacent to a distal end thereof for receiving a fixture (not shown) to secure the base 10 onto the heat-generating component.

The fin group 20 is separated from the base 10 and comprises a plurality of fins 22 spaced from each other. The fins 22 are substantially rectangular metallic sheets and parallel to the base 10. A plurality of air passages are defined between every two neighboring fins 22 for airflow from the fan 60 flowing therethrough to bring heat into ambient environment. Two elongated slots 24 are respectively defined in the two lateral sides of the fin group 20 by recessing inwardly from opposite lateral edges of the fins 22. Each elongated slot 24 perpendicular to the fins 22, has a U-shaped cross section with two inner faces facing each other. Two elongated receiving grooves 240 are defined in the two inner faces of the elongated slot 24 and perpendicular to the fins 22. The receiving grooves 240 are collinear along a front-to-rear direction of the fin group 20. The receiving grooves 240 and the elongated slot 24 are extended upwardly through a top of the fin group 20. Therefore, the fan holder 50 can be engaged into the receiving grooves 240 from upper openings thereof at the top of the fin group 20.

Each heat pipe 30 is bent into a U-shape and comprises an evaporation section (not labeled) and two condensation sections (not labeled) extending upwardly from two opposite ends of the evaporation section. The evaporation sections of the heat pipes are juxtaposed to each other and embedded in the bottom surface of the base 10. The evaporation sections have bottom surfaces coplanar with the bottom surface of the base 10 and contacting with the heat-generating component. The condensation sections of the heat pipes 30 spaced from each other are perpendicularly extended through the fin group 20 and securely received in a plurality of receiving holes (not labeled) defined in the fin group 20. The condensation sections are divided into two rows corresponding to the two opposite ends of the evaporation sections and located adjacent to the two lateral sides of the fin group 20.

The heat dissipating member 40 is received in a space defined between a bottom of the fin group 20 and a top of the base 10 and located between the two rows of the condensation sections of the heat pipes 30. The heat dissipating member 40 comprises a rectangular conducting plate 42 intimately contacting with the top surface of the base 10 and a plurality of conducting flakes 44 extending upwardly from a top surface of the conducting plate 42. The conducting flakes 44 are spaced from each other, parallel to two opposite side edges of the conducting plate 42 and perpendicular to the conducting plate 42. Top ends of the conducting flakes 44 are preferred to reach a bottom surface of the fin group 20 for firmly supporting the fin group 20.

Figure 3:
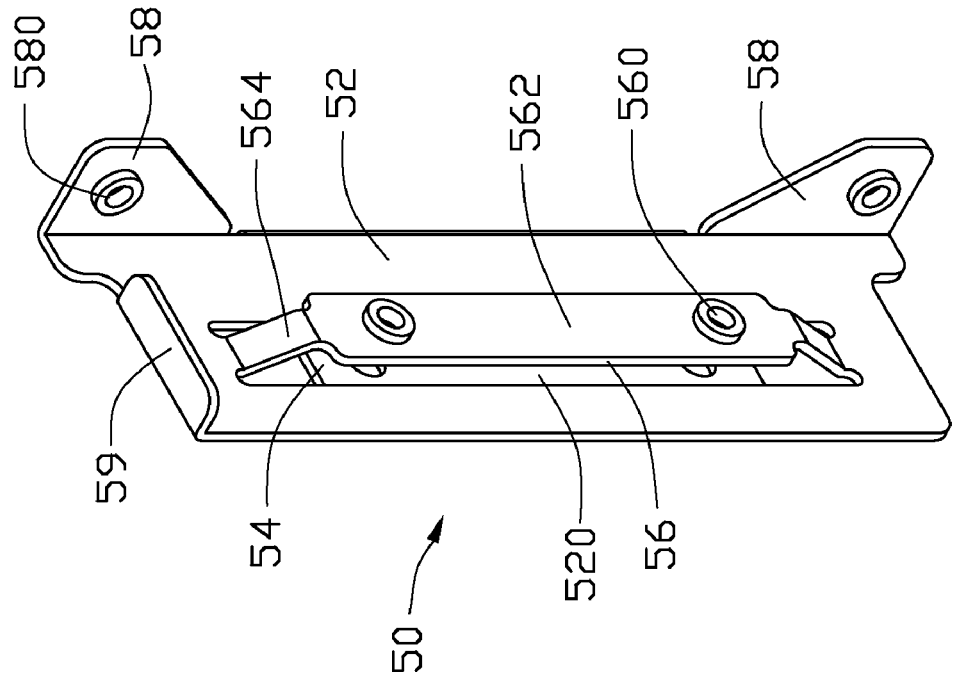
FIG. 3 is an enlarged view of a fan holder of the heat dissipation device in FIG. 2.
Figure 4:
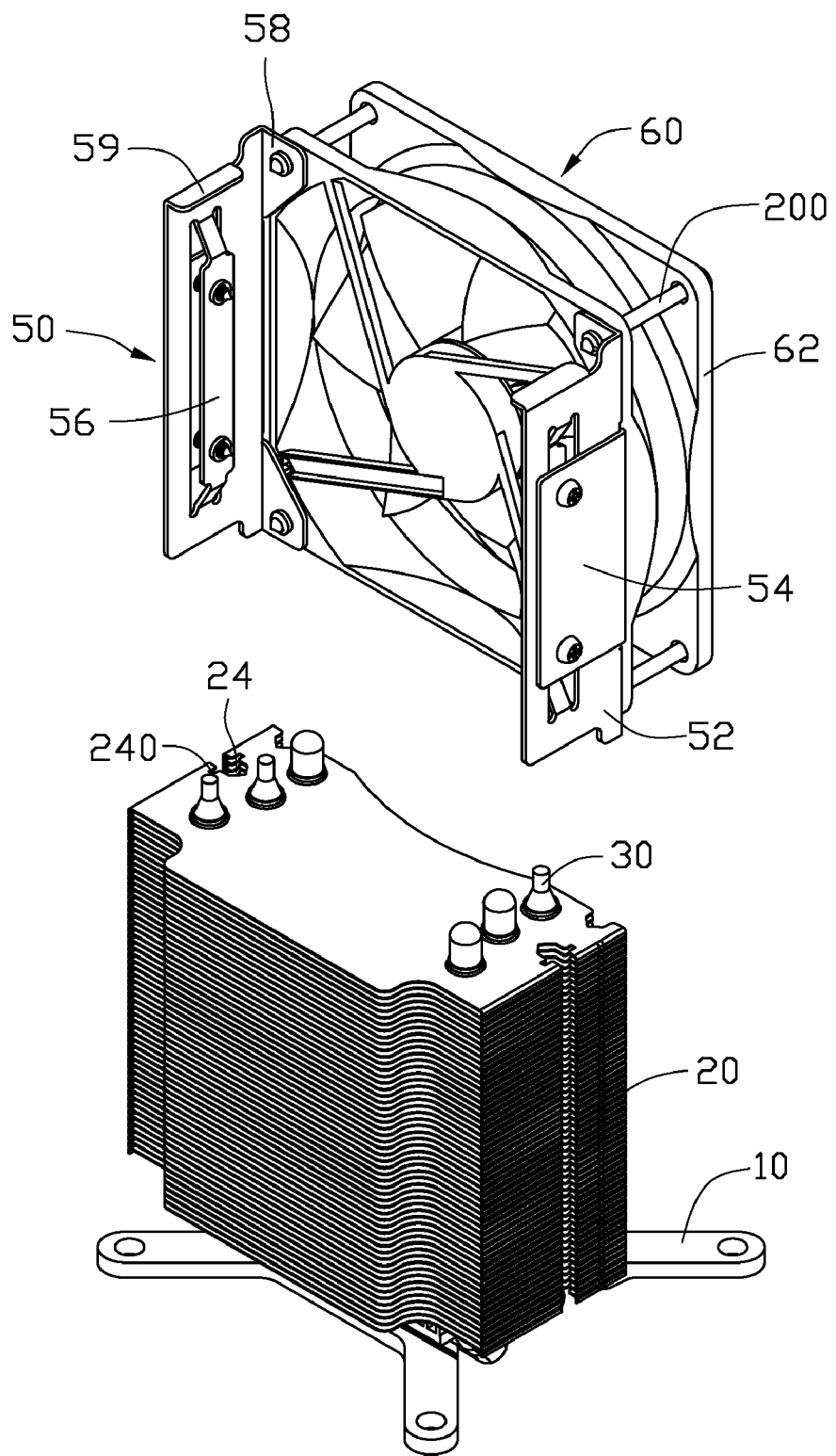
FIG. 4 is a partially assembled view of the heat dissipation device in FIG. 2.
Figure 5:
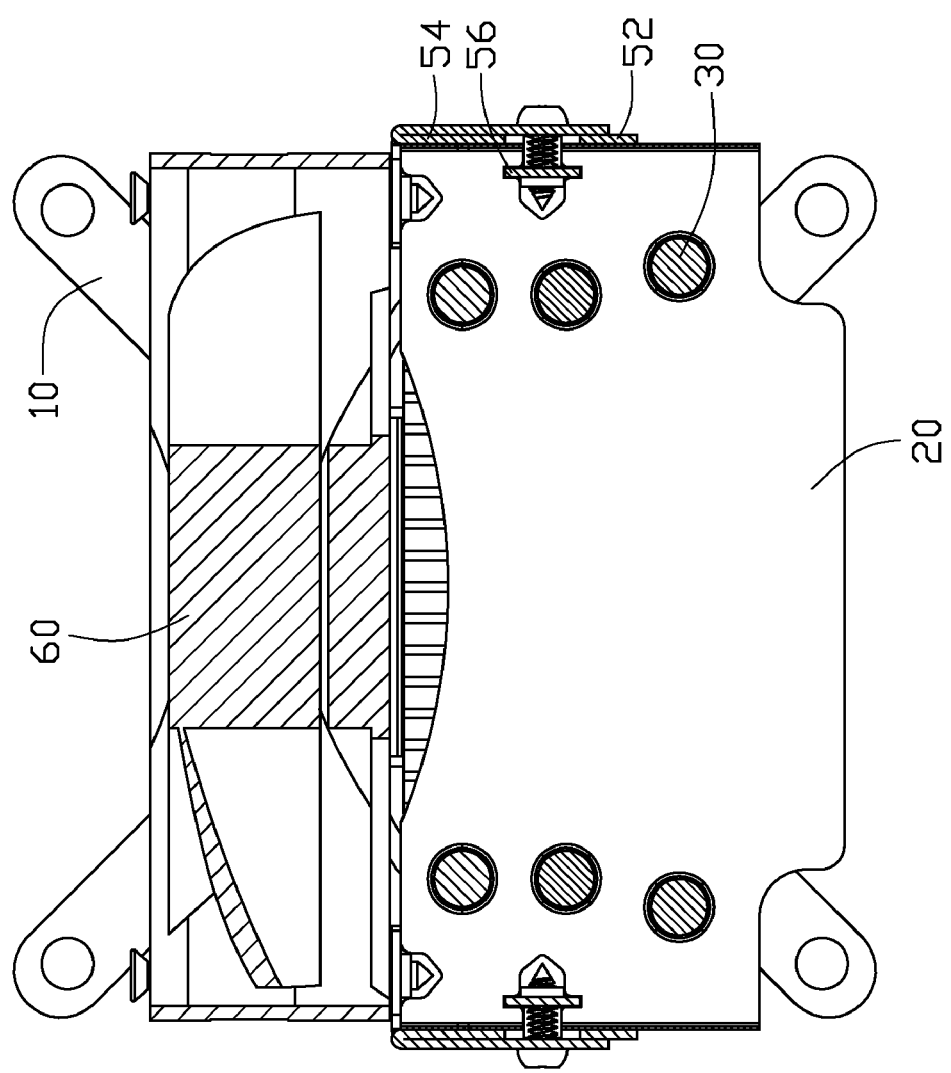
FIG. 5 is a cross section view of the heat dissipation device of FIG. 1, taken along line V-V thereof.

Also referring to FIG. 3, each fan holder 50 is made of metallic material and comprises a main plate 52, a holding plate 54 folded outwardly and backwardly from a middle portion of a front edge of the main plate 52, a locking plate 56 projecting inwardly from a middle of the main plate 52 toward the fin group 20 and received in the elongated slot 24 in one lateral side of the fin group 20, two retaining ears 58 extending perpendicularly and inwardly from upper and lower portions of the front edge of the main plate 452 onto a front side of the fin group 20 and a restricting flange 59 bent inwardly from a top edge of the main plate 52. The main plate 52 of each fan holder 50 is rectangular and attached to the lateral side of the fin group 20 and has a lower portion (not labeled) projecting downwardly beyond a bottom of the fin group 20. A vertical, elongated opening 520 corresponding to the locking plate 56 is defined in the middle of the main plate 52, which extends along a height (lengthwise) direction of the main plate 52 and is perpendicular an extending plane of each of the fins 22 of the fin group 20.

The holding plate 54 of each fan holder 50 is rectangular and folded backwardly to cover a middle potion of the elongated opening 520 of the main plate 52. The holding plate 54 is parallel to the main plate 52 and defines two spaced holding holes 540 therein, which are in communication with the elongated opening 520 of the main plate 52.

The locking plate 56 of each fan holder 50 comprises an elongated locking part 562 and two connecting parts 564 respectively extending obliquely from two opposite ends of the locking part 562 and connecting to upper and lower inner edges of the elongated opening 520 of the main plate 52. The locking part 562 is in alignment with the elongated opening 520 of the main plate 52, parallel and separated from the main plate 52. Two spaced locking holes 560 are defined in the locking part 562 and respectively in alignment with the two holding holes 540 of the holding plate 56 for engagingly receiving two operating screws 100 extending through the two holding holes 540. The locking part 562 has a width larger than that of the two connecting parts 564, whereby the locking part 562 can be inserted into and received in the two receiving grooves 240 in the elongated slot 24 of the fin group 20 from their upper opening at the top of the fin group 20.

The two retaining plates 58 of each fan holder 50 are located over two neighboring corners of the front side of the fin group 20. Each retaining plate 58 defines a retaining hole 580 therein for engagingly receiving a fixture 200 extending through the fan 60 to fix the fan 60 at the front side of the fin group 20. The restricting flange 59 of each fan holder 50 extends horizontally from the top edge of the main plate 52 to rest on the top of the fin group 20 to hold the fan holder 50 in place.

The fan 60 has a rectangular frame (not labeled) having a size substantially equal to a sum of the sizes of the front sides of the fin group 20 and the heat dissipating member 40. The frame has two separated fixing flanges 62 at each corner thereof. Each the flange 62 defines a fixing hole 620 therein for receiving the fixture 200.

To assemble the fan 60 of the heat dissipation device, the four fixtures 200 are extended through the fixing holes 320 in four corners of the fan 60 and engagingly received in the four retaining holes 580 of the two fan holders 50 to couple the fan 60 and the fan holders 50 together. The two fan holders 50 are then lowered down from the top of the fin group 20 to abut against two lateral sides of the fin group 20 with the two locking parts 562 of the two locking plates 56 of the two fan holder 50 simultaneously being inserted into the corresponding receiving grooves 240 in the two elongated slots 24 of the fin group 20. Finally, the two operating screws 100 loosely received in the holding holes 540 of the holding plates 54 of the two fan holder 50 are driven by a screwdriver to further screw into the corresponding locking holes 560 of the locking plates 56 to force the locking plates 56 move toward the corresponding main plate 52 of the fan holders 50. Accordingly, the locking plates 56 and the corresponding main plates 52 tightly clamp two portions of the fin group 20 therebetween after the locking plates 56 are forced to respectively move toward the corresponding main plates 52 to thus securely fix the fan 60 on the front side of the fin group 20 and the heat dissipating member 40.

A detachment of the fan 50 from the fin group 20 can be easily achieved by loosening the operating screws 100 to let the locking plates 56 move away from the corresponding maim plates 52 to return to their original positions and then lifting the fan 60 away from the fin group 20.

In use of the heat dissipation device, heat generated by the heat-generating component is partially conducted to the heat dissipating member 40 through the base 10 and simultaneously transferred to the fin group 20 via the heat pipes 30. Airflow generated by the fan 60 flows through the heat dissipation member 40 and the fin group 20 to bring the heat accumulated in the heat dissipation member 40 and the fin group 20 into ambient environment to thus effectively cool the heat-generating component.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device comprising:
    a fin group defining two elongated slots in two opposite lateral sides thereof and two receiving grooves in two opposing inner faces of each elongated slot, the receiving grooves having openings at a top of the fin group;
    two fan holders each having a main plate attached to a lateral side of the fin group and a locking plate connected to an inner side of the main plate and being inserted into the two receiving grooves of a corresponding elongated slot from the openings at the top of the fin group; and
    a fan being secured to retaining plates of the two fan holders at a front side of the fin group;
    wherein the locking plate comprises a locking part separated from the main plate by two connecting parts respectively extending obliquely from two opposite ends of the locking part to connect the main plate; and
    wherein two operating screws extend through the main plate to be engagingly received in two locking holes defined in the locking part of the locking plate and can be further screwed into the locking holes to force the locking part to move toward the main plate to thus secure each fan holder to the fin group.

2. The heat dissipation device as claimed in claim 1, wherein the locking part has a width larger than that of the two connecting parts, and two lateral portions of the locking part are received in the two receiving grooves of the corresponding elongated slot.

3. The heat dissipation device as claimed in claim 1, wherein the main plate defines an elongated opening therein corresponding to the locking plate for allowing the operating screws extending therethrough and has a holding plate bent backwardly from a front edge of the main plate to cover a middle potion of the elongated opening.

4. The heat dissipation device as claimed in claim 3, wherein the holding plate is parallel to the main plate and the locking part of the locking plate and defines two holding holes therein receiving the two operating screws therein.

5. The heat dissipation device as claimed in claim 1, wherein the corresponding elongated slot is U-shaped in cross section and wholly receives the locking plate therein, and wherein the fin group comprises a plurality of fins spaced from each other, each fin extending along a plane which is perpendicular to the elongated slots and the locking plates.

6. The heat dissipation device as claimed in claim 1, wherein a restricting flange is bent inwardly from a top edge of the main plate of each fan holder and rested on the top of the fin group to hold the fan holder in place.

7. The heat dissipation device as claimed in claim 1, wherein the retaining plates are extended perpendicularly from upper and lower portions of the front edge of the main plate of each fan holder and located over corners of the front side of the fin group.

8. The heat dissipation device as claimed in claim 7, wherein a retaining hole is defined in each retaining plate of the fan holder and engagingly receives a fixture extended through a corner of the fan to secure the fan at the front side of the fin group.

9. The heat dissipation device as claimed in claim 1, further comprising a base separated from the fin group, a plurality of heat pipes thermally connecting the base and the fin group together and a heat dissipating member sandwiched between the fin group and the base.

10. The heat dissipation device as claimed in claim 9, wherein each heat pipe comprises an evaporation section embedded in a bottom surface of the base and two condensation sections extending upwardly from two opposite ends of the evaporation section through the fin group.

11. The heat dissipation device as claimed in claim 10, wherein the heat dissipating member is located between the two condensation sections of each heat pipe and comprises a conducting plate in contact with a top surface of the base and a plurality of conducting flakes arranged on a top surface of the conducting plate.

12. The heat dissipation device as claimed in claim 11, wherein a plurality of air passages are defined in the fin group and the heat dissipating member for airflow generated by the fan flowing therethrough.

13. A heat dissipation device comprising:
a base;
a fin group defining two elongated slots in two opposite lateral side thereof and two receiving grooves in two opposing inner faces of each elongated slot, the receiving grooves having openings at a top of the fin group;
a plurality of heat pipes thermally connecting the base and the fin group together;
a heat dissipating member placed on a top surface of the base and located between the base and the fin group;
two fan holders each having a main plate attached to a lateral side of the fin group and a locking plate connected to an inner side of the main plate and being inserted into the two receiving grooves of a corresponding elongated slot from the openings at the top of the fin group; and
a fan being fixed over front sides of the fin group and the heat dissipating member by the two fan holders;
wherein each locking plate comprises a locking part separate from the main plate by two connecting parts respectively extending obliquely from two opposite ends of the locking parts to connect the main plate; and
wherein the main palate defines an elongated opening therein corresponding to the locking plate for operating screws extending therethrough and has a holding plate bent backwardly from a front edge of the main plate to cover a middle potion of the elongated opening.

14. The heat dissipation device as claimed in claim 13, wherein the locking part has a width larger than that of the two connecting parts, and two lateral portions of the locking part are received in the two receiving grooves.

15. The heat dissipation device as claimed in claim 13, wherein the holding plate is parallel to the main plate and the locking part of the locking plate and defines two holding holes for receiving the operating screws therein.

16. The heat dissipation device as claimed in claim 13, wherein a restricting flange is bent inwardly from a top edge of the main plate of each fan holder and rested on the top of the fin group to hold the fan holder in place, and two retaining plates are extended perpendicularly from upper and lower portions of the front edge of the main plate of each fan holder and located over two corners of a front side of the fin group, a retaining hole being defined in each retaining plate of the fan holder and engagingly receiving a fixture extended through a corner of the fan to secure the fan at the front side of the fin group.

17. A heat dissipation device comprising:
a fin group defining two elongated slots in two opposite lateral side thereof and two receiving grooves in two opposing inner faces of each elongated slot, the receiving grooves having openings at a top of the fin group;
two fan holders each having a main plate attached to a lateral side of the fin group and a locking plate connected to an inner side of the main plate and being inserted into the two receiving grooves of a corresponding elongated slot from the openings at the top of the fin group; and
a fan being fixed over front sides of the fin group by the two fan holders;
wherein the main plate of each of the two fan holders defines an elongated opening therein corresponding to the locking plate for operating screws extending therethrough and has a holding plate bent backwardly from a front edge of the main plate to cover a middle potion of the elongated opening.

18. The heat dissipation device of claim 17, wherein the locking plate of each of the two fan holders comprises a locking part separate from the main plate by two connecting parts respectively extending obliquely from two opposite ends of the locking parts to connect the main plate.

19. The heat dissipation device of claim 17 further comprises a base connecting with the fin group by a heat pipe.

20. The heat dissipation device of claim 19 further a heat dissipating member located between the base and the fin group.

* * * * *